United States Patent [19]

Ohkawa

[11] Patent Number: 5,225,740
[45] Date of Patent: Jul. 6, 1993

[54] METHOD AND APPARATUS FOR PRODUCING HIGH DENSITY PLASMA USING WHISTLER MODE EXCITATION

[75] Inventor: Tihiro Ohkawa, La Jolla, Calif.

[73] Assignee: General Atomics, San Diego, Calif.

[21] Appl. No.: 857,981

[22] Filed: Mar. 26, 1992

[51] Int. Cl.⁵ .............................................. H05H 1/18
[52] U.S. Cl. ........................ 315/111.41; 315/111.21; 313/231.31; 204/298.37
[58] Field of Search ................ 315/111.21, 111.41, 315/111.71, 111.81; 313/231.31; 204/298.38, 298.37

[56] References Cited

U.S. PATENT DOCUMENTS

| | | | |
|---|---|---|---|
| 3,373,357 | 3/1968 | Keenan et al. | 315/111.41 X |
| 4,101,411 | 7/1978 | Suzuki et al. | 204/298 |
| 4,401,054 | 8/1983 | Matsuo et al. | 118/723 |
| 4,507,588 | 3/1985 | Asmussen et al. | 315/39 |
| 4,585,668 | 4/1986 | Asmussen et al. | 427/38 |
| 4,630,566 | 12/1986 | Asmussen et al. | 118/50.1 |
| 4,691,662 | 9/1987 | Roppel et al. | 118/50.1 |
| 4,727,293 | 2/1988 | Asmussen et al. | 315/111.41 |
| 4,745,337 | 5/1988 | Pichot et al. | 315/111.41 |
| 4,810,935 | 3/1989 | Boswell | 315/111.41 |
| 4,876,983 | 10/1989 | Fukuda et al. | 118/722 |
| 4,990,229 | 2/1991 | Campbell et al. | 204/298.06 |
| 5,003,225 | 3/1991 | Dandl | 315/111.41 |
| 5,081,398 | 1/1992 | Asmussen et al. | 315/111.41 |

OTHER PUBLICATIONS

Plasma Processing of Materials: Scientific Opportunities and Technological Challenges; National Academy Press, pp. 13-36, (Washington, D.C. 1991).

*Primary Examiner*—Eugene R. LaRoche
*Assistant Examiner*—Do Hyun Yoo
*Attorney, Agent, or Firm*—Fitch, Even, Tabin & Flannery

[57] ABSTRACT

High density plasma is produced in a long cylindrical cavity by the excitation of a high frequency whistler wave within the cavity. The cylindrical cavity, and hence the plasma, is imbedded in a high magnetic field, with magnetic lines of force passing axially (longitudinally) through the cavity. The magnetic field has an electron cyclotron frequency associated therewith that is much greater than the wave frequency associated with the whistler wave. In one embodiment, electromagnetic energy is coupled axially into the cylindrical cavity using a resonant cavity, which coupled energy excites the whistler wave. In another embodiment, electromagnetic energy is coupled radially into the cylindrical cavity using a slow wave structure. The plasma is created without using electrodes; and the excitation of the whistler wave is achieved at a high Q value. Various configurations are used to couple between the resonant cavity or circuit and the plasma, thereby allowing the invention to be used for numerous applications, such as plasma processing, e.g., plasma etching, stripping or deposition; or the excitation of high power lasers; ion sources; or sputtering guns.

14 Claims, 3 Drawing Sheets

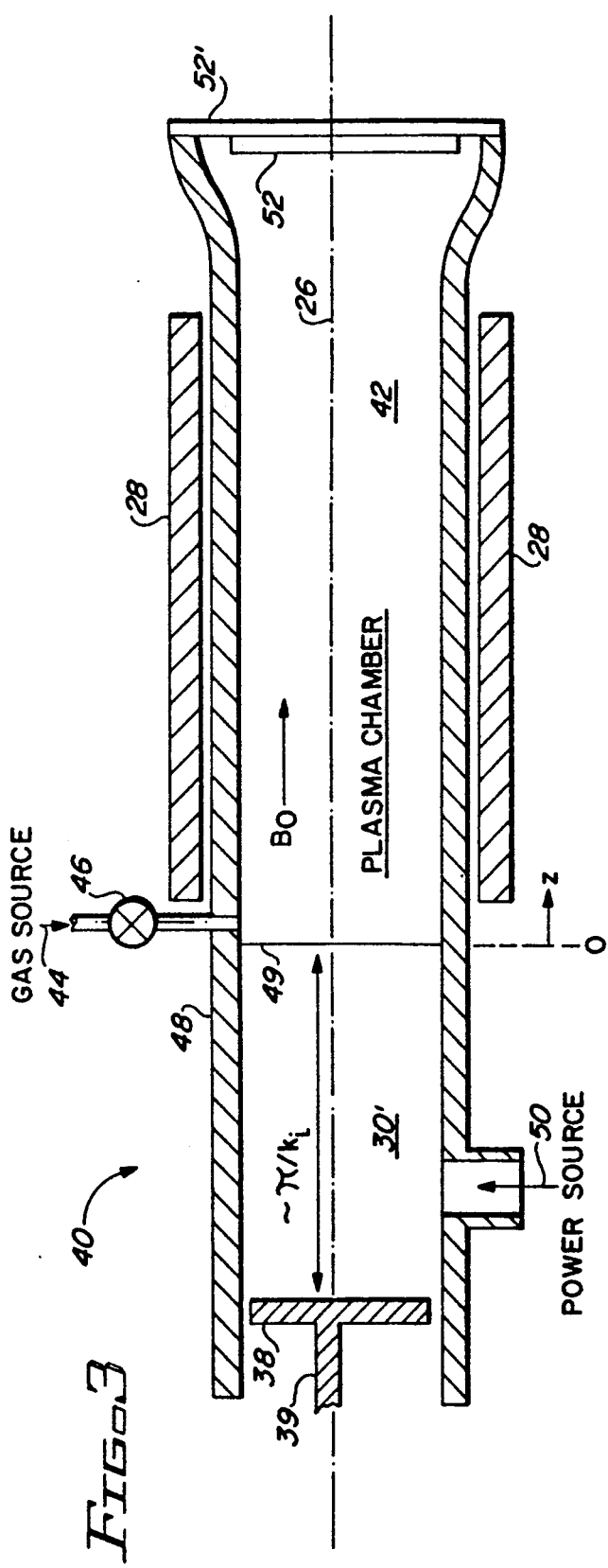
FIG. 3
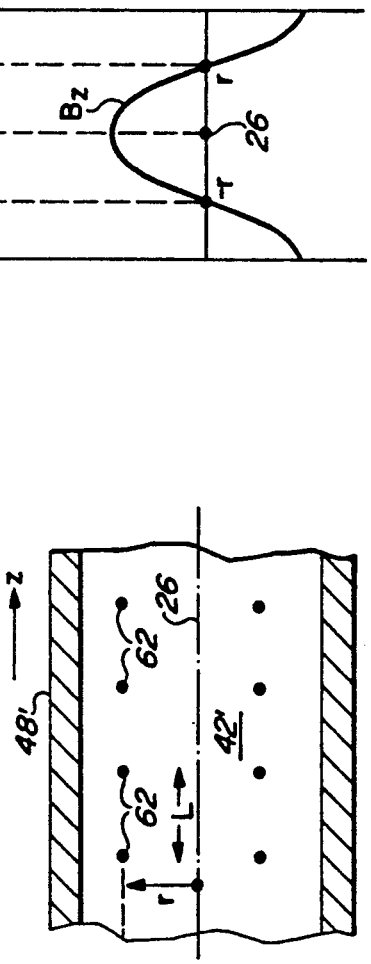
FIG. 4C
FIG. 4B
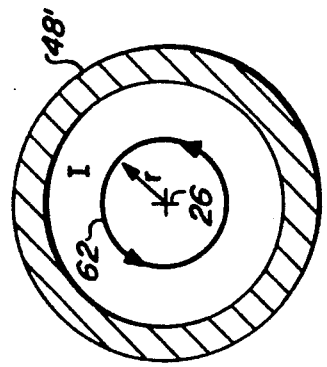
FIG. 4A

METHOD AND APPARATUS FOR PRODUCING HIGH DENSITY PLASMA USING WHISTLER MODE EXCITATION

BACKGROUND OF THE INVENTION

The present invention relates to apparatus and methods for producing high density plasma for use with plasma processing and other applications, such as high power lasers. More particularly, the invention relates to plasma production apparatus and methods that axially or radially excite whistler waves in a cylindrical plasma imbedded in a high magnetic field.

A plasma is an ionized gas. Because a plasma is a gas, it exhibits fluid characteristics that allow it to fill a desired space, assume a specific shape, or otherwise be formed for desired purposes. Because a plasma is an ionized gas, it is electrically conductive, meaning that electrical currents can flow therethrough, and the plasma can be controlled and managed to a certain extent through the application of magnetic and electric fields. Because a plasma is ionized, the ionized atoms and atomic particles therein may be chemically active or energetic, and can thereby also be used to trigger or promote a desired chemical reaction or physical process, e.g., the removal of material, as is done in plasma etching.

Most known applications for using plasma are significantly enhanced if the density of the plasma can be increased and maintained. Disadvantageously, most known techniques for making and maintaining a plasma do not result in a high density plasma. Hence, there is a need in the art for high density plasma production techniques.

There are several ways in which a plasma can be made. One of the most effective ways to make a plasma is to inject microwave energy into a gas. The energy associated with the microwave signal ionizes molecules and atoms in the gas, thereby forming the plasma Unfortunately, there is a limit to how dense the plasma can become As the plasma begins to form and become more dense, for example, it also becomes more conductive and starts to appear as an electrical short. Such an electrical short can reflect the microwave signal out of the plasma. Thus, the microwave energy may only be able to penetrate into the plasma a short distance before it is reflected out of the plasma. For this reason, the prior art teaches limiting the thickness of the plasma into which the microwave energy is injected. See, e.g., U.S. Pat. No. 4,507,588 (Asmussen et al.); U.S. Pat. No. 4,585,668 (Asmussen et al.); U.S. Pat. No. 4,691,662 (Roppel et al.); and U.S. Pat. No. 4,727,293 (Asmussen et al.); wherein the plasma is confined to a very shallow disk.

Unfortunately, a shallow plasma disk is of limited utility for many plasma processing applications. There are at least two reasons for this. First, the "loss rate" of the plasma in a shallow disk may be higher than the loss rate for a "long" or "deep" plasma. (The "loss rate" of a plasma is the rate at which the plasma is lost either through the ions and electrons in the plasma recombining to form neutral molecules and atoms in the gas or through the ions and electrons hitting the walls of the containment vessel. In the formation of a plasma, an equilibrium point is thus reached where the ion production rate equals the ion loss rate. The loss rate may depend on such factors as the surface to volume ratio.) Second, a shallow plasma disk does not generally provide a sufficient volume of plasma for efficient use in downstream processing applications. Downstream processing applications preferably position the microwave plasma formation apart from the location where the plasma is used. See, e.g., *Plasma Processing of Materials*, p. 31 National Research Council, (National Academy Press, Washington, D.C., 1991). It would thus be desirable for the plasma volume positioned upstream from the location where the plasma is used to be a relatively large volume, such as a "long" or "deep" plasma cylinder, or equivalent large volume, rather than a relatively small volume, such as a shallow plasma disk. What is needed, therefore, is a technique that allows a microwave signal to be injected into a plasma volume without having the microwave signal reflected back out of the plasma due to the plasma's conductivity, thereby allowing a "deeper" or "longer" plasma volume, and thus a potentially larger plasma volume, to be formed and maintained at a location upstream from the location where the plasma is to be used.

In order to prevent the plasma from shorting out, it is known in the art to immerse the plasma in a strong magnetic field. The strong magnetic field, in general, makes it more difficult for the charged particles within the plasma to cross the magnetic field lines, and thus prevents the charged particles from shorting out. Hence, by orienting the microwave electric field used to create the plasma so that it is perpendicular to the magnetic field in which the plasma is immersed, it is possible to prevent the shorting of the plasma, and thereby improve the density limit of the plasma. U.S. Pat. No. 4,101,411 (Suzuki et al.); U.S. Pat. No. 4,401,054 (Matsuo et al.); U.S. Pat. No. 4,810,935 (Boswell); and U.S. Pat. No. 4,876,983 (Fukuda et al.) are all examples of prior art apparatus and devices that utilize microwaves and a magnetic field for various plasma processing operations.

However, even when a magnetic field is used to prevent the plasma from shorting, the injected microwave signal is still subject to damping, and such damping imposes a further density limit on the plasma. What is needed, therefore, is a technique for injecting microwaves into a plasma while increasing the density limit imposed by the damping of the microwave signal.

Two sources of damping have been identified in the prior art. The first is collisional damping, caused by collisions between electrons associated with the injected microwave energy and the ions and neutral gas molecules present in the plasma. The more dense the ions or molecules in the plasma, the more collisions that occur, and the more difficult it is for the wave to penetrate further into the plasma. Collisional damping is believed to be the factor that has heretofore limited the available plasma density in the prior art devices. See, e.g., U.S. Pat. No. 4,990,229 (Campbell et al.), where the use of an excitation frequency of 13.56 MHz for the microwave energy creates a collision frequency on the order of $2.5 \times 10^8$ sec$^{-1}$. Such a collision frequency corresponds to a plasma density of about $10^{19}$ m$^{-3}$ ($10^{13}$ cm$^{-3}$). It would be desirable if a plasma density greater than $10^{13}$ cm$^{-3}$ could be achieved.

The second source of damping is collisionless damping, also known as Landau damping. Landau damping results when the particles in the plasma have a velocity nearly equal to the phase velocity of the microwave signal injected into the plasma. The theory is that because the particles in the plasma travel with the microwave signal, they do not see a rapidly fluctuating electric field, and hence can effectively exchange energy with the microwave signal. Further, although there are electrons in the plasma that travel faster and slower than the microwave signal, the distribution of electrons is such that there are more slow electrons than fast electrons. Hence, there are more particles taking energy from the microwave signal than adding to it, and the microwave signal becomes quickly damped. Landau damping is best controlled by assuring that the phase velocity of the injected microwave signal is sufficiently larger than the thermal velocity of the particles in the plasma.

It is known in the art to use a so called "whistler wave", also known as a helicon wave, in a plasma producing apparatus. See, e.g., U.S. Pat. No. 4,990,229 (Campbell, et al.). A whistler wave propagates along the magnetic field lines. Its frequency should be much less than the electron cyclotron frequency, $\omega_{ce}$. (The electron cyclotron frequency, $\omega_{ce}$, is equal to $eB/mc$ where e and m are the electron charge and mass, respectively; B is the magnetic field strength; and c is the speed of light.) In order to excite the desired whistler wave in the plasma, Campbell, et al. show particular types of antenna configurations used to surround the plasma chamber of a given plasma processing device. These antenna configurations are determined by the frequency of the rf excitation that is used, which Campbell, et al. teach, must be a low frequency, e.g. 13.56 MHz. Collisional damping thus remains the limiting factor for configurations such as those shown in Campbell et al. Hence, what is needed is a means of exciting plasma, e.g., by using whistler mode microwave signals, in a way that increases the density limit caused by collisional damping.

The present invention advantageously addresses the above and other needs.

SUMMARY OF THE INVENTION

In accordance with one aspect of the present invention, there is provided apparatus that creates a high density plasma in a long cylindrical cavity. As used herein, the term "high density plasma" refers to a plasma having a density in excess of about $10^{12}$ cm$^{-3}$. The cylindrical cavity, and hence the plasma, is imbedded in a high magnetic field, with magnetic lines of force passing axially (longitudinally) through the cavity. In one embodiment, electromagnetic radiation is coupled axially into the cylindrical cavity using a resonant cavity in order to excite a whistler wave in the cylindrical cavity, and hence in the plasma. In another embodiment, electromagnetic radiation is coupled radially into the cylindrical cavity using a slow wave structure in order to excite the whistler wave in the plasma. In either embodiment, the plasma is advantageously created without using electrodes; and the excitation of the whistler wave is achieved at a high Q value, thereby allowing radio frequency (rf) power to be transmitted into the plasma at a good efficiency. For purposes of the present application, the definition of "Q" is that 1/Q is proportional to the fraction of energy lost per cycle of oscillation. Thus, if Q is large, a larger amount of energy may be stored in the resonant cavity. By "high Q" value, it is meant that the Q of the resonant circuit or cavity in the absence of a plasma must be high enough so that the dominant power loss will be to the plasma.

In accordance with another aspect of the invention, various geometries are provided for coupling energy between the resonant cavity and the plasma. Such varied geometries advantageously allow the invention to be used for numerous applications, for example, plasma processing applications, such as plasma etching, stripping or deposition; high power laser excitation applications; ion source applications; or sputtering gun applications.

For plasma processing applications, such as plasma etching, stripping or deposition, the invention provides the requisite coupling between a resonant cavity and a plasma column. A strong magnetic field is axially applied to the plasma column. The magnetic field has an electron cyclotron frequency $\omega_{ce}$ associated therewith ($\omega_{ce}=eB/mc$, as previously described). A whistler wave having a sufficiently high frequency, $\omega$, e.g., $\omega/2\pi=2.45$ GHz, is excited in the plasma column. Advantageously, the use of the whistler wave at such a high frequency increases the limiting collision frequency, thereby increasing the achievable plasma density. However, the use of higher frequencies and densities requires a totally different excitation geometry from that used in the prior art. The present invention advantageously provides such different excitation geometries. In a preferred geometry, for example, axial coupling is provided between a resonant cavity and the plasma column, with the resonant cavity being positioned at one end of the plasma column. In an alternative geometry, multiple loop structures are placed within the plasma chamber in order to radially excite the desired whistler wave in the plasma. Advantageously, such geometries yield plasma densities well in excess of those achievable using prior art devices. Further, the use of the resonant cavity allows for a high Q-value, thereby providing for the efficient coupling of rf energy into the plasma.

For high power laser applications, an axial excitation is inconvenient because it interferes with the optical system, which optical system typically utilizes two facing mirrors between which the lasing medium resonates. Hence, the present invention provides that the whistler wave is excited with a radial excitation geometry that comprises a microwave cavity with periodically slotted gaps that surround a cylindrical plasma chamber. The spacing of the gaps is determined by the wavelength of the excited mode.

For high density ion source applications, accelerating grids are placed at the end of the plasma column in either a radially or axially excited system to create a high density ion beam.

For sputtering gun applications, a sputtering target is placed in front of the grids of a high density ion source. The ion beam may then be directed towards the target, thereby creating a high density sputtering apparatus.

It should thus be apparent that it is a feature of the invention to provide apparatus and methods for producing dense plasma usable in a wide variety of applications, such as plasma processing, e.g., plasma etching, stripping or deposition; lasers; ion sources; or sputtering guns.

It is a further feature of the invention to provide configurations or geometries wherein microwave or other rf energy can be transmitted to penetrate into a gas confined within a suitable "long" cavity while allowing a high density plasma to be formed within the cavity. In particular, it is a feature of the invention to provide such apparatus and geometries wherein high frequency microwave energy, e.g., greater than 1 Ghz, may be coupled into the plasma so as to excite a whistler wave therein, which high frequency whistler wave advantageously allows for a much higher plasma density.

It is an additional feature of the invention to provide a technique for axially or radially exciting high frequency whistler waves in a cylindrical plasma imbedded in a high magnetic field.

It is yet a further feature of the invention to provide a means for exciting plasma without using electrodes.

It is still an additional feature of the invention to provide a means of exciting a whistler wave in a cylindrical plasma through the use of a resonant cavity.

BRIEF DESCRIPTION OF THE DRAWINGS

The above and other aspects, features and advantages of the present invention will be more apparent from the following more particular description thereof, presented in conjunction with the following drawings and Appendix wherein:

FIG. 3 diagrammatically illustrates a plasma processing device made in accordance with the present invention utilizing the axial coupling shown in FIG. 2A;

FIG. 4A shows a perpendicular cross section of a $TE_{01}$ slow wave structure that may be used to radially excite a whistler mode in a plasma processing device in accordance with the present invention;

FIG. 4B shows a longitudinal cross section of the structure of FIG. 4A;

FIG. 4C depicts a cross sectional profile of the axial magnetic field component associated with the structure of FIG. 4A;

Figure 1:
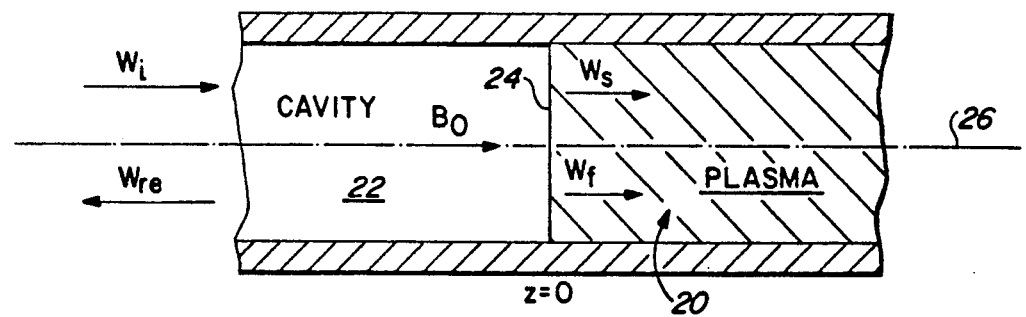
FIG. 1 illustrates the interface between a microwave cavity and a plasma, and schematically depicts how an input wave excites both slow and fast waves in the plasma, as well as reflects from the plasma interface.

Appendix A provides a mathematical analysis of the use of a whistler wave to produce a high density plasma.

Corresponding reference characters indicate corresponding components throughout the several views of the drawings.

DETAILED DESCRIPTION OF THE INVENTION

The following description is of the best mode presently contemplated for carrying out the invention. This description is not to be taken in a limiting sense, but is made merely for the purpose of describing the general principles of the invention. The scope of the invention should be determined with reference to the claims.

As indicated above, the present invention relates to the production of a high density plasma by axially or radially exciting whistler waves (one form of rf energy) in a cylindrical plasma imbedded in a high magnetic field. The strength of the magnetic field is sufficiently high so that the electron cyclotron frequency is several times greater than the wave frequency. In general, two conditions must be met in order to produce a high density plasma. First, a wave of rf energy must be transmitted so as to propagate into the plasma, thereby causing the requisite discharge to occur that creates and maintains the plasma. Second, once transmitted, the wave must not damp too quickly. A whistler wave advantageously does not have a high density cutoff associated therewith. Hence, such wave can easily penetrate into the plasma to sustain the requisite discharge, thereby fulfilling the first condition. The second condition means that the rf frequency must be higher than the electron collision frequency with the plasma ions and the neutral gas molecules, and the wave must not experience excessive collisionless damping. Hence, the second condition may be satisfied largely through the proper selection of the rf frequency for the particular application at hand.

As will be evident from the description that follows, the present invention provides specific geometries that may be used to excite rf energy in the form of a whistler wave in a deep or long plasma cavity, thereby promoting the formation and maintenance of high density plasma within such cavity. Both the geometry of the launcher and the geometry of the plasma cavity are important. Such geometries will vary somewhat depending upon the particular application for which the plasma is being used.

Figure 2A:
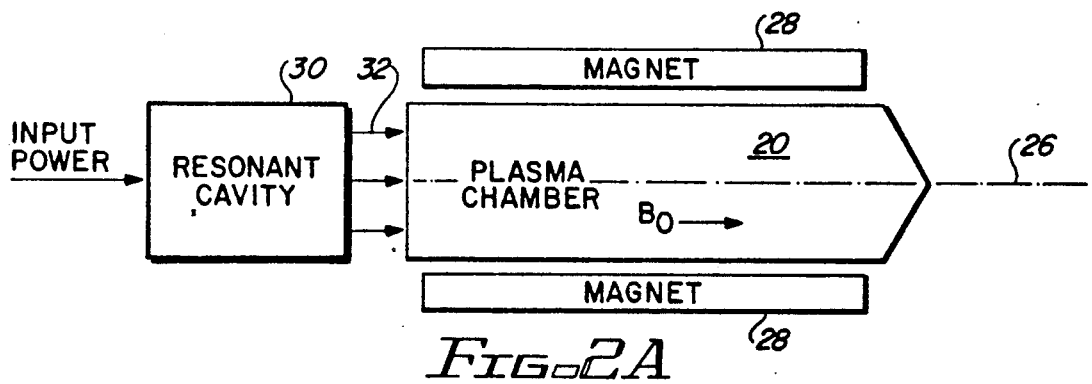
FIG. 2A shows a preferred configuration for axially coupling rf energy into a plasma chamber so as to excite a whistler wave therein.
Figure 2B:
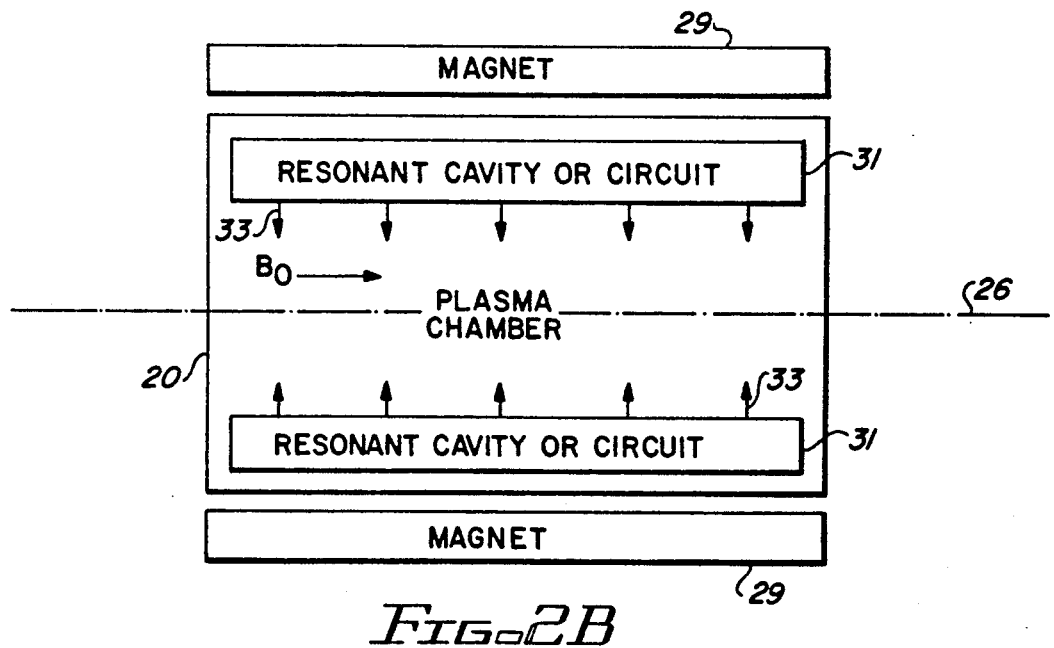
FIG. 2B similarly shows a preferred configuration for radially coupling rf energy into a plasma chamber so as to excite a whistler wave therein.

Before describing some of the preferred geometries associated with the invention, it will be helpful to first present a brief overview of some basic concepts applicable to the coupling of rf energy into a plasma chamber. The description presented below in connection with FIGS. 1, 2A and 2B is intended to provide such a brief overview. A mathematical analysis of such coupling principles may be found in Appendix A, attached hereto and incorporated herein by reference. A good overview of the role plasma processing now plays, and will play in the years to come, may be found in *Plasma Processing of Materials, Scientific Opportunities and Technological Challenges,* National Research Council (National Academy Press, Washington, D.C. 1991).

Referring first to FIG. 1, a plasma chamber 20 is shown adjacent a microwave cavity 22. An interface 24 separates the microwave cavity 22 from the plasma chamber 20. The interface 24 is located (assuming an appropriate coordinate system having a z-direction that is horizontal for the orientation shown in FIG. 1) at z=0. In general, the plasma chamber 20 is cylindrically shaped, having a longitudinal axis 26 passing through the center thereof in the z-direction, thereby allowing the formation of a "deep" or "long" plasma (as compared to a shallow or thin disk-shaped plasma, as described in the prior art). A deep or long plasma is important because it provides a larger plasma mass having a lower loss rate, thereby giving rise to a higher density plasma. In addition, a deep or long plasma better provides for the possibility of downstream plasma processing. Note that as shown in FIG. 1, the microwave cavity 22 is aligned with the longitudinal axis 26 of the plasma chamber.

In order to couple rf energy into the plasma chamber, an input wave $W_i$ is excited in the microwave cavity 22, or equivalent rf energy source, so as to propagate in the z-direction towards the plasma chamber 20. The presence of a strong magnetic field $B_0$, having lines of force that are substantially parallel to the longitudinal axis 26, helps guide the input wave $W_i$ in the desired direction, and further helps confine the plasma within the plasma chamber 20. As explained more fully in Appendix A, if a high density plasma is to be produced, it is important that the electron cyclotron frequency (associated with the magnetic field $B_0$) be much larger than the wave frequency (associated with the whistler wave), and that the wave frequency, in turn, be larger than the collision frequency (associated with the creation and maintenance of the plasma).

The input wave $W_i$, upon encountering the interface 24, excites a slow wave $W_s$ and a fast wave $W_f$ in the plasma. The fast wave is cut off at high density. The slow wave continues to propagate in the z-direction. A portion of the wave $W_i$ is also reflected from the interface as a wave $W_{re}$. The present invention describes various geometries suitable for directing the input wave $W_i$ into the plasma chamber 20 so that the desired slow wave $W_s$, or whistler wave, is launched in the plasma chamber. The energy associated with the slow wave, or whistler wave, is then efficiently transferred to the gas in the plasma chamber 20 in order to ionize the gas, thereby forming the desired plasma. The plasma thus formed is then available for use for a desired application.

A preferred approach for launching or coupling rf energy into the plasma chamber in order to excite the desired whistler wave is illustrated in FIGS. 2A and 2B. In FIG. 2A, such launching involves axially coupling the microwave energy into the plasma chamber in order to excite the desired whistler wave. In FIG. 2B, such launching involves radially coupling the microwave energy into the plasma chamber in order to excite the desired whistler wave.

Referring to FIG. 2A, a resonant cavity 30 is positioned at one end of the plasma chamber 20. Appropriate input power is directed into the resonant cavity 30 so as to excite a resonant condition, which resonant condition is manifest by the presence of a resonant signal. A resonant condition advantageously assures that reflected energy is not wasted, but rather goes back into the resonance for later use. This is especially true when a high Q resonance exists. The resonant signal may comprise an appropriate microwave signal, e.g., of the $TE_{01}$ or $TE_{11}$ modes, which when it enters the plasma chamber 20 launches the desired whistler wave in the plasma. The resonance of the cavity operates at a high Q value, thereby allowing a portion 32 of the energy associated with the resonant signal to be efficiently coupled into the plasma chamber 20. As further seen in FIG. 2A, a suitable magnetic field generating means 28, which may comprise a coil wound around the plasma chamber 20, generates the requisite magnetic field $B_0$ needed to help sustain the production of the high density plasma.

Similarly, referring to FIG. 2B, an annular resonant structure 31 is positioned around the periphery of the plasma chamber 20. Appropriate input power is directed into the resonant structure 31 so as to excite a high Q resonant condition, which resonant condition is manifest by the presence of a resonant signal. Such resonant signal may comprise an appropriate microwave signal, e.g., of the $TE_{01}$ or $TE_{11}$ modes, which excites the desired axially traveling whistler wave in the plasma. The magnetic and electrical fields at the boundary of the plasma chamber 20 that are created by the resonant electrical current excite the desired axially traveling whistler wave in the plasma. The resonance of the cavity operates at a high Q value, thereby allowing a portion 33 of the energy associated with the resonant signal to be efficiently coupled into the plasma chamber 20. As further seen in FIG. 2B, a suitable magnetic field generating means 29, which may comprise a coil wound around the plasma chamber 20, generates the requisite magnetic field $B_0$ needed to help sustain the production of the high density plasma.

Turning next to FIG. 3, a diagrammatic illustration of a plasma processing device 40 made in accordance with the present invention is shown. The device 40 represents one particular geometry that may be used to axially launch a whistler wave into a plasma chamber 42. As seen in FIG. 3, the plasma chamber 42 comprises a cylindrical chamber 42 coupled to a suitable source of gas 44 through an inlet valve 46. The side walls 48 of the plasma chamber 42 may be made from any suitable material, and are preferably simply an extension of the walls of a resonant cavity 30'. A window 49, which may be made of any suitable material through which microwave energy may readily propagate, such as fused quartz (glass), separates the plasma chamber 42 from the resonant cavity 30'. The resonant cavity 30' may be of conventional waveguide construction, having conductive walls 48. The waveguide construction is preferably a circular waveguide. However, it is to be understood that the waveguide construction may be a generalized cylinder. That is, the waveguide structure could be a rectangular waveguide or any other single conductor waveguide of constant cross sectional shape and size relative to the cylindrical axis 26.

As indicated above, adjacent one end of the plasma chamber 42, and still within the waveguide construction 48 (and preferably as part of the waveguide construction 48) is an adjustable resonant cavity 30'. The adjustable resonant cavity has a movable end plate 38 at the end thereof opposite the plasma chamber 42. The movable end plate 38, in turn, is coupled to an adjustable plunger 39. The plunger 39 may be selectively adjusted back and forth in the z-direction in order to tune the cavity 30' to a desired resonant condition, in conventional manner.

For the desired resonant condition, the length of the cavity 30' is adjusted to be equal to approximately $\pi/k_i$, where $k_i$ is the wave number of the desired waveguide mode for the microwave resonance. The desired resonant condition excites a microwave signal in the appropriate mode having a frequency preferably greater than 1 GHz, such as 2.45 GHz. Input power 50 is coupled into the cavity 30' from a suitable input power source (not shown) in conventional manner to establish the resonant condition in the cavity 30' at a high Q value. The cavity can either be at high vacuum or at atmospheric pressure A coil 28, or equivalent magnetic field generating means, is wound around the plasma chamber 42 in order to provide the requisite magnetic field $B_0$. A mathematical description of the excitation of a resonant microwave signal in the resonant cavity 30', and the coupling of the energy associated with such microwave signal into the plasma chamber 42 in order to launch the desired whistler wave in the plasma is provided in Appendix A.

As an example of apparatus built in accordance with FIG. 3, a tunable resonant cavity is made from circular waveguide having an inner diameter of about 8.6 cm and a length of about 30 cm. A window 49 made of silicon quartz is placed in the waveguide in order to create a boundary between the resonant cavity and a plasma chamber. The plasma chamber is made from the same waveguide structure, having an inner diameter of about 8.6 cm and a length of about 50 cm. A mixture of argon and CH$_4$ gas is injected into the plasma chamber. The partial pressures of these gases are on the order of 10 militorr. An axial magnetic field B$_0$ of approximately 0.5 Tesla is established in the plasma cavity. A wave of 2.45 GHz of the TE$_{11}$ mode is set up as a resonant signal in the resonant cavity. The wave power is 3 kW. The resonant cavity has an unloaded Q value of about 5000. The density of the plasma formed in the plasma chamber as a result of the microwave energy coupled into the plasma chamber has a density of approximately 10$^{14}$ cm$^{-3}$. Higher density plasmas are achievable using, inter alia, a stronger magnetic field.

The geometry shown in FIG. 3 is best suited for high density plasma processing applications. For example, a workpiece 52 that is to be etched by the high density plasma may be positioned near the end of the chamber 42 opposite the resonant cavity 30'. Conventional means may be used to direct the plasma to the workpiece to control its flow so as to etch the workpiece 52 in a desired pattern. Etching of the workpiece occurs, for example, when the plasma streams along the magnetic field lines in the plasma chamber and strikes the workpiece, thereby depositing kinetic energy that heats and etches the workpiece. The workpiece 52 may be attached to an end plate 52' of the chamber 42, or it may be positioned some distance downstream from the chamber 42, depending upon the application. The workpiece need not have the same approximate cross sectional area as the chamber 42, as the plasma can be spread out or narrowed by application of appropriate magnetic fields. For some applications, the workpiece, in conventional manner, may be masked with appropriate materials that protect certain areas of the workpiece and expose other areas, with the exposed areas being those that are to be etched.

Alternatively, instead of a workpiece 52 and end plate 52', a set of accelerating grids may be placed at the end of the plasma chamber 42 to produce a high density ion beam. A high density sputtering gun may also be realized by inserting a target in front of the accelerating grids.

Advantageously, the high density plasma that is produced using the geometry shown in FIG. 3 makes possible the very rapid etching of extremely fine patterns. Further, for similar applications, requiring a plasma enhanced chemical vapor deposition (PCVD), plasma sputtering, or reactive sputter deposition, a high plasma density, such as is available with the geometry shown in FIG. 3, significantly speeds up the processing operation. An increased processing speed is made possible because the dissociation and activation rates (in PCVD), the sputter rate (in plasma sputtering), and the chemical reaction rate (in reactor sputter deposition) are all proportional to the plasma density See, e.g., H. Yasuda, *Plasma Polymerization*, Academic Press, 1985.

It is to be noted that axial coupling of the microwave energy so as to launch the whistler wave in the plasma chamber is not the only launching mechanism that may be used. Radial coupling of the microwave energy is also possible. Slow wave structures that promote radial coupling, and that include multiple loop geometries are illustrated in FIGS. 4A-5B. It is noted that in a waveguide containing a plasma, as seen in FIG. 1, there are fast waves W$_f$ and slow waves W$_s$. The fast waves are cut off in the presence of high density plasma. The slow waves remain. The slow wave is the desired whistler mode. Hence, in order to radially launch a whistler wave in the plasma cavity, a suitable slow wave structure may be used.

Referring to FIG. 4A, for example, there is shown a perpendicular cross section of a slow wave structure that may be used to radially excite the TE$_{01}$ whistler mode in the plasma chamber. FIG. 4B shows a longitudinal cross section of the structure of FIG. 4A; and FIG. 4C depicts a cross sectional profile of the magnetic field intensities associated with the structure of FIG. 4A. The magnetic field produced by the loop is designed to match the magnetic field of the desired TE$_{01}$ waveguide mode. Accordingly, the loop radius is determined by the radius at which B$_2$=0 for the mode. Similarly, FIG. 5A shows a perpendicular cross section of another slow wave structure that may be used to radially excite the TE$_{11}$ whistler mode in the plasma chamber; while FIG. 5B shows a longitudinal cross section of the structure of FIG. 5A.

Referring first to FIGS. 4A and 4B, the desired slow wave structure includes a circular waveguide structure 48' centered about a longitudinal axis 26. The waveguide structure 48' has a plurality of loops 62 positioned therewithin at a radius "r". The interior of the waveguide structure 48' functions as a plasma chamber 42'. The loops 62 are evenly spaced along the chamber 42' in the z-direction (longitudinal direction) so as to periodically load the waveguide, thereby promoting the formation of the desired slow (whistler) wave at a wavelength that is related to the loop spacing "L". An electrical current "I" flows in each of the loops.

The cross sectional profile of the axial magnetic field (B-field) B$_2$ in the radial direction for the structure of FIG. 4A is shown in FIG. 4C. Note that the B-field is a maximum of one polarity at the interior wall surface, and a maximum of the other polarity in the center of the waveguide, and is zero at the radial location of the loop 62.

Figure 5A:
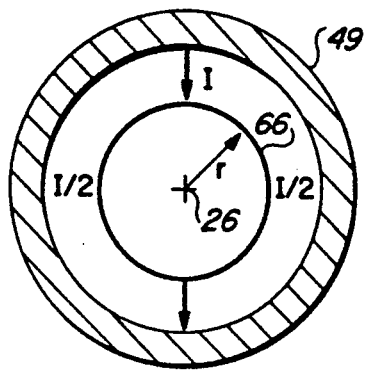
FIG. 5A shows a perpendicular cross section of a $TE_{11}$ slow wave structure that may be used to radially excite a whistler mode in a plasma processing device in accordance with the present invention.
Figure 5B:
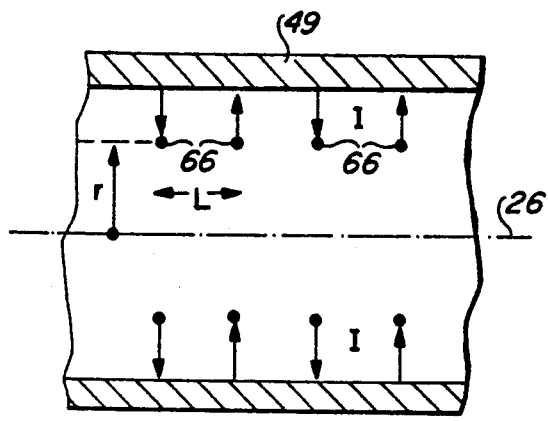
FIG. 5B shows a longitudinal cross section of the structure of FIG. 5A.

FIGS. 5A and 5B show an alternative slow wave structure suitable for exciting the TE$_{11}$ mode. The circular waveguide structure 49 is similar to that shown in FIGS. 4A and 4B. That is, periodically spaced loops 6 are placed within the waveguide structure 49 so as to reside inside the plasma chamber. As seen best in FIG. 5A, a current "I" flows in each loop 66, as shown in FIG. 5A, with the current splitting between two halves of the loop. (The current flow direction is indicated by the direction of the arrowheads applied to the loop 66.) However, as seen in FIG. 5B, the direction of the current flow is different for adjacent loops, with the current flowing in a first loop from the top of the waveguide structure 49 to the bottom, and the current flowing in an adjacent loop from the bottom of the waveguide structure to the top.

The launching geometries shown above in FIGS. 3-5B are best suited for high density plasma processing applications, as discussed above. This is because the axial or radial coupling frees up at least one end of the plasma chamber for extracting or using the plasma for its desired purpose. Numerous other applications would benefit from the existence of a high density plasma. For example, all gas lasers require some means for exciting the lasing medium (a gas). For high power lasers, it is necessary to produce a high excitation rate of the lasing medium. A high density plasma advantageously provides a convenient mechanism in such a laser for producing the requisite high excitation rate. Thus, another application for the high density plasma produced by the present invention is to excite the lasing medium of a high power gas laser.

Unfortunately, the axial excitation of a laser is not convenient because it interferes with the optical system associated with the laser. However, radial excitation may be used. A preferred geometry that may be used in accordance with the present invention to radially excite a whistler wave in a laser gas medium is diagrammatically illustrated in FIG. 6.

Figure 6:
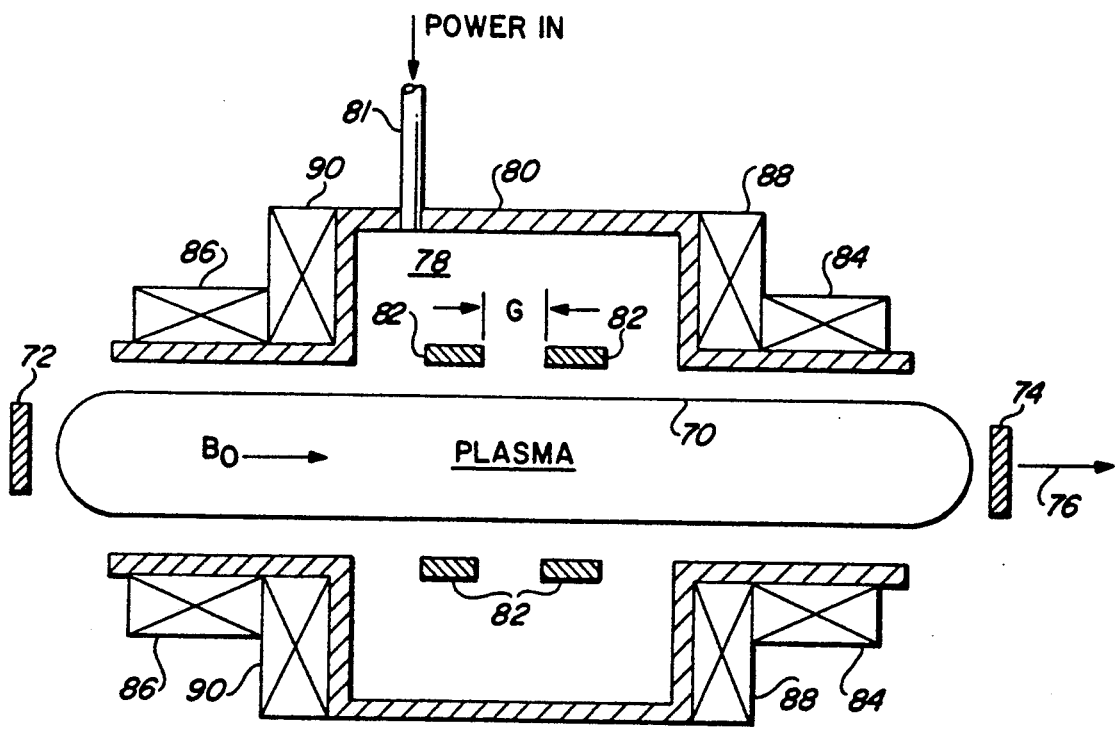
FIG. 6 diagrammatically illustrates a slotted resonant cavity used to radially excite a whistler wave in a high power gas laser.

As shown in FIG. 6, a cylindrical plasma chamber 70 is positioned between two reflective surfaces (mirrors) 72 and 74. For laser operation, at least one of the mirror surfaces, e.g., the mirror 74, is partially transmissive, thereby allowing the laser output 76 to be used for a desired purpose. The plasma chamber 70 is typically made from a quartz tube. As depicted in FIG. 6, the plasma chamber 70 is centered within a cavity 78 that includes an outer wall 80 and inner rings 82. The outer wall and inner rings function as a microwave cavity with periodically slotted gaps. The spacing of the gaps, i.e., the spacing "G" between the rings 82 is determined as a function of the wavelength of the excited mode. For the geometry shown in FIG. 6, it is assumed that the excited mode is a whistler wave in the microwave region, e.g., having a frequency greater than about 1 GHz.

Four sets of coils 84, 86 and 88, 90, or equivalent, surround the cavity 78 on the outside of the wall 80. In combination, the coils 84, 86, 88 and 90 provide a uniform B-field within the plasma chamber 70. The excited whistler wave, in combination with the uniform B-field, promote the formation of high density plasma within the chamber 70, which high density plasma allows the laser operation to take place.

As described above, it is thus seen that the present invention provides apparatus and methods for making dense plasma that may be used for a wide variety of applications, from plasma processing, e.g., plasma etching, to lasers, ion sources, and sputtering guns.

As further described above, it is seen that the present invention provides specific geometries or configurations wherein high frequency microwave or other rf energy may be launched into a gas confined within a suitable "long" cavity. The high frequency of the rf energy allows for an increased density limit imposed by collisional damping, thereby allowing a high density plasma to be formed within the cavity. Advantageously, the launched energy in the long cavity is in the form of a whistler wave, which whistler wave, in combination with a suitable axial magnetic field, allows the high density plasma to be created.

As also described above, it is seen that the invention provides a plasma production device and/or method wherein the desired whistler wave is excited in the plasma by either axially or radially coupling microwave or other rf energy into the plasma chamber, as best suits the needs for the particular application at hand with which the plasma is used. The desired whistler wave is excited through the use of a high Q resonant cavity.

Further, it is seen from the above description that the invention provides a means for exciting plasma without using electrodes.

While the invention herein disclosed has been described by means of specific embodiments and applications thereof, numerous modifications and variations could be made thereto by those skilled in the art without departing from the scope of the invention set forth in the claims.

APPENDIX A

A.1 General Considerations
A.2 Transmitting Power Across a Plasma/Vacuum Interface
A.3 Laser Application

A.1 GENERAL CONSIDERATIONS

Electrodeless plasma production is preferred because of the absence of impurities from electrodes. Microwave-produced plasma is limited in its density because of the cut-off at the plasma oscillation frequency.

A good candidate for an electromagnetic wave capable of transmitting through high density plasma is a helicon (whistler) wave. The main characteristic of the whistler mode is that plasma electrons execute ExB motion, or equivalently only the Hall current is driven in plasma. The whistler mode does not have a cut-off frequency due to high density. However, there are still limits as to the achievable plasma density. When the electron collision frequency becomes comparable to the wave frequency, the whistler mode cannot propagate any longer. The electron collision frequency $V_e$ is given by $$V_e = \approx 2.5 \times 10^{-11} n_e (T_e/e)^{-3/2} \qquad (2)$$

where $n_e$ is the electron density, $T_e$ is the electron temperature, and e is an electron charge. The plasma electron temperature used in plasma processing is in the range of a few eV. By assuming $n_e = 10^{19}$ m$^{-3}$ and $T_e = 1$ eV, the collision frequency is $2.5 \times 10^8$ sec$^{-1}$. Hence, at low frequencies, e.g., 13.56 MHz, a density of $10 \text{ m}^{-3}$ is close to the upper limit.

For plasma assisted chemical vapor deposition (PCVD), a neutral gas as well as plasma is present. The electron collision frequency $V_{eo}$ in such instance (with gas atoms or molecules present) is given by $$V_{eo} \approx 6 \times 10^5 n_o \sigma (T_e/e)^{\frac{1}{2}} \qquad (b)$$

where $n_o$ is the neutral gas density and $\sigma$ is the cross section of electron collision with gas molecules. By taking $\sigma = 10^{-20}$ m$^2$ and $T_e = 1$ eV, it is seen that $V_{eo} \sim 6 \times 10^{-15} n_0$. The neutral density at which $V_{eo}$ is equal to $2.5 \times 10^8$ sec$^{-1}$ is $4 \times 10^{22}$ m$^{-3}$. This density value corresponds to about 1 torr of pressure.

The electron density can be increased through the use of a magnetic field in the whistler wave. The whistler wave, as is known, propagates in a direction parallel to the magnetic lines of force. When the phase velocity of the wave is comparable or less than the electron thermal velocity, the wave is damped strongly by Landau damping. To avoid or minimize Landau damping, the phase velocity should be larger than the electron thermal velocity. This condition may be expressed as $$\omega/k > \sqrt{2T_e/m_e} \qquad (c)$$

where $\omega$ is the frequency (radial) of the whistler wave, $T_e$ is the electron temperature, $M_e$ is the electron mass, and k is the wave number. At the high density limit, this condition may be expressed as $$\omega/k \sim c\sqrt{\omega/\Omega} \quad (d)$$

where c is the speed of light and $\Omega$ is the characteristic frequency, defined as $$\Omega = \frac{en_e}{\epsilon_0 B_0} \quad (e)$$

where $\epsilon_0$ is the permittivity of free space, and $B_0$ is the magnetic field. By equating $\omega$ with the collision frequency given by Eq. (a), the above condition becomes $$B_0 > 2.4 \times 10^{-3} \left(\frac{T_e}{e}\right)^{5/2} \quad (f)$$

Eq. (f) thus indicates that Landau damping can be avoided (or at least minimized) by going to a higher (stronger) magnetic field.

It is thus evident from the above analysis that a higher rf frequency is required to obtain higher plasma density. Microwaves at 2.45 GHz, for example, may be a good choice because of an abundant supply of commercially available power sources at this frequency. The use of a circular (cylindrical) waveguide may also be a good choice as the characteristics of such waveguides are well known. Thus, in Section A.2, an analysis is presented of the coupling that exists between vacuum modes and plasma modes in a cylindrical (circular) waveguide having a transparent window 24 separating the vacuum and plasma regions (as illustrated in FIG. 1 of the patent specification).

In addition to the considerations set forth above and in Section A.2, it should be noted that the frequency of the whistler wave, e.g., 2.45 GHz, should be much lower than the electron cyclotron frequency. The cyclotron frequency $\omega_{ce}/2\pi$ is given by $$\frac{\omega_{ce}}{2\pi} \simeq 3 \times 10^{10} B \quad (g)$$

A magnetic field of 1 Tesla is a convenient choice. The Landau damping criterion is well satisfied. The characteristic frequency $\Omega$ then becomes $$\Omega = 1.6 \times 10^{-8} n_e \quad (h)$$

At a density of $n_e = 10^{21}$ m$^{-3}$, $\Omega = 1.6 \times 10^{13}$ and the condition that $\Omega >> \omega$ is satisfied. The approximate value of the wave number, $k_S$, is given by $$k_s \sim \frac{\sqrt{\omega\Omega}}{c} = 1.5 \times 10^3 m^{-1} \quad (i)$$

and the wavelength $2\pi/k$ becomes $$\frac{2\pi}{k_s} \sim 4 \times 10^{-3} m \quad (j)$$

The required power flux is estimated by calculating the plasma loss. If the plasma leaves the region at the sound velocity, the power loss P per unit area is given by $$P = c_s n_e q \quad (k)$$

where q is the energy expended per ion-electron pair. By using $C_s \sim 10^4$ msec$^{-1}$, $n_e = 10^{21}$ m$^{-3}$ and q=100 eV, it is seen that $P \sim 1.6 \times 10^8$ W m$^{-2}$ or 16 kW/cm$^2$.

In summary, it is seen from the above and the material presented in Sections A.2 and A.3 that the production of high density plasma by the whistler mode is possible. The limit set by electron collision frequency forces the use of a higher frequency. In turn, a higher frequency results in a higher magnetic field. Wave guides may be used to launch the whistler mode in the plasma either axially or radially. The axial coupling is preferred because of the high Q of the cavity. Plasma densities on the order of $10^{21}$ m$^{-3}$ can be achieved. Numerous applications are possible, such as PCVD, and plasma propulsion.

A.2 TRANSMITTING POWER ACROSS A PLASMA/VACUUM INTERFACE

1. Introduction

This is a study of the mode coupling between vacuum modes and plasma modes in a cylindrical wave guide with a transparent window separating the vacuum and plasma regions. It is desired to determine the reflected and transmitted power from an incident vacuum wave.

There are two components of this mode coupling problem. The first is the determination of the allowed plasma modes in the cylinder. This requires the plasma dispersion relation—the relationship between the perpendicular and parallel wave numbers of the modes—and the boundary conditions on the electric and magnetic fields at the wall of the cylinder. The vacuum modes are presented in Section 2 and the plasma modes in Section 3. For the plasma mode calculation, the full cold plasma dispersion relations which permit a finite electric field parallel to the imposed magnetic field are used. As a result of the finite parallel electric field, the radial structure of the modes must be considered as being in effect the linear superposition of two solutions of the dispersion relation for a given parallel wave number. The spectrum of the plasma modes which satisfy the given boundary conditions for both angular symmetries m=0 and m=1 have been established numerically. These modes depend upon $\omega/\omega_{ce}$, $\omega/\omega_{pe}$, and the radius of the cylinder, where $\omega$ is the frequency of the modes, $\omega_{ce}$ is the electron cyclotron frequency (a measure of the magnetic field), and $\omega_{pe}$ is the electron plasma frequency (a measure of the plasma density).

The second component of the mode coupling is the matching of the boundary conditions for the electric and magnetic fields across the transparent window separating the vacuum and plasma window. Because the radial dependence of each of the plasma and vacuum modes is different, a linear superposition of an infinite number of modes is required for the exact match. Approximate solutions based upon a finite number of modes are discussed in sections 4 and 5.

Calculations were performed for three different configurations, each of which employs a different incident waveguide mode (TE$_{11}$, TE$_{10}$, and TM$_{10}$). For each of these configurations, the reflected power and transmitted power were calculated for a low density, medium density, and high density plasma. In principle, one can treat this problem by taking a finite number of modes and finding an approximate solution and then include a few more modes to verify that the approximate solution is not changed much, i.e., to verify that the solution is converging. In practice, there are significant numerical difficulties with the calculations and results for the $TM_{10}$ case are the least accurate. However, the results indicate that sufficient power is transmitted to the plasma, even at high densities, for all three configurations to be viable; a cavity Q of 100 should be sufficient.

Numerical results are presented in Section 6 where the results are tabulated in Table 1.

2. Vacuum Modes

The cylindrical vacuum modes must satsify $$\Delta \times \overline{E} = -\partial_t \overline{B} \tag{1}$$

and $$\nabla \times \overline{B} = \frac{1}{c^2} \partial_t \overline{E} \tag{2}$$

All fields may be assumed to be proportional to $e^{ik_s z + im\theta - i\omega t}$ and the solutions fall into two classes: The TM modes ($B_z = 0$) given by $$B_{zm} = 0 \tag{3}$$

$$B_{rm} = \frac{m\omega^2}{k_z k_\perp c^2} A_m \frac{J_m(k_\perp r)}{k_\perp r}$$

$$B_{\theta m} = \frac{i\omega^2}{k_z k_\perp c^2} A_m J'_m(k_\perp r)$$

$$E_{zm} = \frac{\omega}{k_z} A_m J_m(k_\perp r)$$

$$E_{rm} = \frac{i\omega}{k_\perp} A_m J'_m(k_\perp r)$$

$$E_{\theta m} = -\frac{m\omega}{k_\perp} A_m \frac{J_m(k_\perp r)}{k_\perp r}$$

where the boundary condition is $J_m(k_\perp a) = 0$, and the TE modes ($E_z = 0$) given by $$B_{zm} = A'_m J_m(k_\perp r) \tag{4}$$

$$B_{rm} = \frac{ik_z}{k_\perp} A_m J'_m(k_\perp r)$$

$$B_{\theta m} = -\frac{mk_z}{k_\perp} A_m \frac{J_m(k_\perp r)}{k_\perp r}$$

$$E_{zm} = 0$$

$$E_{rm} = -\frac{m\omega}{k_\perp} A_m \frac{J_m(k_\perp r)}{k_\perp r}$$

$$E_{\theta m} = -\frac{i\omega}{k_\perp} A_m J'_m(k_\perp r)$$

where the boundary condition is $J'_m(k_\perp a) = 0$. $A_m$ is a constant which determines the wave amplitude and the $J_m$s are Bessel functions. The dispersion relation for all of these modes is $$\omega^2 = (k_\perp^2 + k_z^2) c^2. \tag{5}$$

The three configurations we consider in this paper are:
1) an incident $TM_{01}$ mode
2) an incident $TE_{01}$ mode
3) an incident $TE_{11}$ mode where in the notation $TM_{mn}$ or $TE_{mn}$ the first index is the value of m and the second index is the nth zero of the relevant Bessel function or Bessel function derivative.

The diameter of the cylinder is chosen so that higher order modes, $n > 1$, are evanescent. Thus for the $TM_{01}$ case, the boundary condition is $J_0(k_\perp a) = 0$, and the first zero of $J_0$ is $k_\perp a = \lambda_{01} = 2.40$. From the dispersion relation, Eq. (5).

$$\omega_{cutoff} = kc_\perp = \lambda_{01} c/a \tag{6}$$

so for fixed $\omega$, we need $a > \lambda_{01} c/\omega$ for propagation. At the same time we want all higher order modes to be evanescent. The next mode is $TE_{01}$ which requires $J'_0(k_\perp a) = 0$. This occurs at $\lambda'_{02} = k_\perp a = 3.83$. (The first zero of $J'_0$ is $\lambda'_{01} = 0$.) So for evanescence we need $a < \lambda'_{02} c/\omega$, which sets the bounds on a. For an experiment at $f = 2.45$ GHz, these conditions become $$4.68 \text{ cm} < a < 7.41 \text{ cm} \tag{7}$$

for $TM_{01}$. For our numerical calculations, we chose $a = 6$ cm.

Similarly, the constraints on a for the $TE_{01}$ case are $$\frac{\lambda'_{02} c}{\omega} < a < \frac{\lambda_{02} c}{\omega} \tag{8}$$

or $$7.41 \text{ cm} < a < 10.76 \text{ cm} \tag{9}$$

and for the $TE_{11}$ case $$\frac{\lambda'_{11} c}{\omega} < a < \frac{\lambda_{11} c}{\omega} \tag{10}$$

or $$3.59 \text{ cm} - a < 7.46 \text{ cm} \tag{11}$$

For our numerical calculations, we chose $a = 10$ cm for $TE_{01}$ and $a = 4$ cm for $TE_{11}$.

3. Plasma Modes

This section follows closely the notation and development of Swanson [1].

Things become considerably more complicated in the present of plasma. Now the two Maxwell equation (Eqs. (1) and (2)) are (assuming $e^{-i\omega t}$)

$$\nabla \times \overline{E} = i\omega \overline{B} \tag{12}$$

and $$\nabla \times \overline{B} = -\frac{i\omega}{c^2} \overline{K} \cdot \overline{E} \tag{13}$$

where K is the cold plasma dielectric tensor given by $$K = \begin{pmatrix} K_1 & K_2 & 0 \\ -K_2 & K_1 & 0 \\ 0 & 0 & K_3 \end{pmatrix} \tag{14}$$

where $$K_1 = 1 - \sum_j \frac{\omega_{pj}^2}{\omega^2 - \omega_{cj}^2} \quad (15)$$

$$iK_2 = \sum_j \frac{\epsilon_j \omega_{cj} \omega_{pj}^2}{\omega(\omega^2 - \omega_{cj}^2)} \quad (16)$$

$$K_3 = 1 - \sum \frac{\omega_{pj}^2}{\omega^2}. \quad (17)$$

The summation over j is a sum over species; $\omega_{pj}$, $\omega_{cj}$, and $\epsilon_j$ are the plasma frequency, cyclotron frequency, and sign of the charge of the jth species respectively. At the frequency and magnetic field we are considering, only the electron contributions are important.

The dispersion relation arising from Eqs. (12) and (13) is a quadratic in $k_\perp^2$, given by $$(g^2 - qd)k_\perp^4 - \left(i\omega q - \frac{idk_3}{\omega}\right)k_\perp^2 - \kappa_3 = 0 \quad (18)$$

where $$g = \frac{ik_z \kappa_2}{\gamma^2 + \kappa_2^2} \quad (19)$$

$$d = \frac{i\omega\gamma}{\gamma^2 + \kappa_2^2} \quad (20)$$

$$q = -\frac{i(k_1 \gamma - \kappa_2^2)}{\omega(\gamma^2 + \kappa_2^2)} \quad (21)$$

and $$\gamma = k_z^2 - \kappa_1. \quad (22)$$

Following Swanson, we have introduced $k_i = (\omega/c)^2 K_i$ for i=1,2,3. Thus for a given $k_z$, two $k_\perp^2$ values satisfy the dispersion relation, and the fields for each mode involve a linear combination of two $k_\perp$ values. A plot of the dispersion relation $k_\perp^2$ vs $k_z^2$ can be made for $\omega = 0.175\omega_{ce}$ and $\omega_{pe}/\omega_{ce} = (0.1, 0.5, 1.0, 10.)$. This choice of $\omega$ is consistent with an experiment at $\omega = 2\pi \times 2.45$ GHz and a magnetic field of 0.5 T. The fields are given by $$B_{zm} = A_m[J_m(k_{\perp 1} r) + \tau_m J_m(k_{\perp 2} r)] \quad (23)$$

$$B_{rm} = ik_z A_m \left[\frac{J_m'(k_{\perp 1} r)}{k_{\perp 1}} + \tau_m \frac{J_m'(k_{\perp 2} r)}{k_{\perp 2}}\right] +$$

$$\frac{m\kappa_1 A_m}{rk_z \kappa_2}\left[\beta_1 \frac{J_m(k_{\perp 1} r)}{k_{\perp 1}^2} + \tau_m \beta_2 \frac{J_m(k_{\perp 2} r)}{k_{\perp 2}^2}\right]$$

$$B_{\theta m} = \frac{i\kappa_1 A_m}{k_2 \kappa_2}\left[\beta_1 \frac{J_m'(k_{\perp 1} r)}{k_{\perp 1}} + \tau_m \beta_2 \frac{J_m'(k_{\perp 2} r)}{k_{\perp 2}}\right]$$

$$E_{zm} = \frac{\omega \kappa_1 A_m}{k_2 \kappa_2 \kappa_3}[\beta_1 J_m(k_{\perp 1} r) + \tau_m \beta_2 J_m(k_{\perp 2} r)]$$

$$E_{rm} = \frac{i\omega A_m}{\kappa_2}\left[\delta_1 \frac{J_m'(k_{\perp 1} r)}{k_{\perp 1}} + \tau_m \delta_2 \frac{J_m'(k_{\perp 2} r)}{k_{\perp 2}}\right] -$$

$$\frac{m\omega}{r} A_m \left[\frac{J_m(k_{\perp 1} r)}{k_{\perp 1}^2} + \tau_m \frac{J_m(k_{\perp 2} r)}{k_{\perp 2}^2}\right]$$

$$E_{\theta m} = -\frac{m\omega A_m}{r\kappa_2}\left[\delta \frac{J_m(k_{\perp 1} r)}{k_{\perp 1}^2} + \tau_m \delta_2 \frac{J_m(k_{\perp 2} r)}{k_{\perp 2}^2}\right] -$$

$$i\omega A_m \left[\frac{J_m'(k_{\perp 1} r)}{k_{\perp 1}} + \tau_m \frac{J_m'(k_{\perp 2} r)}{k_{\perp 2}}\right]$$

where $$\beta_j = \gamma - \frac{\kappa_2^2}{\kappa_1} + k_{\perp j}^2$$

and $$\delta_j = \gamma + k_{\perp j}^2$$

and $\tau_m$ is determined from the boundary conditions. The boundary conditions at r=a are $E_\theta = E_z = B_r = 0$; $E_z = 0$ yields $$\beta_1 J_m(k_{\perp 1} a) + \tau_m \beta_2 J_m(k_{\perp 2} a) = 0 \quad (24)$$

and $E_\theta = 0$ implies $$\frac{J_m'(k_{\perp 1} a)}{k_{\perp 1}} + \tau_m \frac{J_m'(k_{\perp 2} a)}{k_{\perp 2}} = \quad (25)$$

$$\frac{im}{a\kappa_2}\left[\delta_1 \frac{J_m(k_{\perp 1} a)}{k_{\perp 1}^2} + \delta_2 \frac{J_m(k_{\perp 2} a)}{k_{\perp 2}^2}\right].$$

It can be ssen that $B_r$ is then necessarily zero because $imE_z/r - ik_z E_\theta = i\omega B_r$, although to demonstrate this from the explicit solutions above requires use of the dispersion relation.

Eliminating $\tau_m$ from the above two equations yields a transcendental equation which must be satisfied to impose the boundary conditions $$\frac{im\delta_1}{k_{\perp 1}^2 a\kappa_2 \beta_1} - \frac{1}{k_{\perp 1} \beta_1} \frac{J_m'(k_{\perp 1} a)}{J_m k_{\perp 1} a} = \quad (26)$$

$$\frac{im\delta_2}{k_{\perp 2}^2 a\kappa_2 \beta_2} - \frac{1}{k_{\perp 2} \beta_2} \frac{J_m'(k_{\perp 2} a)}{J_m k_{\perp 2} a}.$$

A $k_\perp^2$ vs $k_z^2$ plot with $\omega = 0.175\omega_{pe}$ and $\omega_{pe} = \omega_{ce}$ can be made that shows some solutions which satisfy the boundary conditions for: 1) m=0; a=10;'TE01', 2) m=0; a=6; 'TM01', 3) m=1, a=4, 'TE11'.

4. Boundary Conditions at the Plasma/Vacuum Interface (z=0)

At the plasma vacuum interface, we assume there is no surface current but there can be a charge build-up. Thus $B_z$, $B_r$, $B_\theta$, $E_r$, and $E_\theta$ must be continuous across the boundary while there can be a jump in $E_z$ due to the surface charge.

The five components $B_z$, $B_r$, $B_\theta$, $E_r$, and $E_\theta$ must be continuous for all r, and since the radial dependence varies from mode to mode, we must introduce a spectrum of modes to satisfy these conditions. Thus, for example, the $B_z$ field is given on the vacuum side by $$B_{zvac} = B_{z,inc} + a_r B_{z,ref} + \sum_{i=1}^{\infty} a_i B_{z,i} \qquad (27)$$

an incident wave, a reflected wave, and a spectrum of higher order evanescent modes which have $k_z^2 < 0$. Similarly, on the plasma side $$B_{zplas} = \sum_{i=1}^{N} b_{pi} B_{zpi} + \sum_{i=1}^{\infty} b_{ei} B_{zei} \qquad (28)$$

the field can be expressed as a linear combination of an infinite number of propagating and evanescent modes. (The number of propagating modes may be finite or infinite, depending upon plasma parameters.)

Analogous equations can be written for the other field components involving the same set of coefficients ($a_r$, $a_i$, $b_{pi}$, $b_{ei}$). The problem is to solve for these coefficients. The radial coordinate r can be eliminated from the equations which match fields across the interface by expanding them in a Fourier-Bessel series, i.e., we apply $\int r J_m(\lambda'_{mi} r/a) dr$ to $B_{z,vac}(z=0) = B_{z,plas}(z=0)$, where $\lambda'_{mi}$ is the ith zero of $J'_m(x)$. We can generate a series of equations for i=1,2,3...

The choice of Bessel function to expand about depends upon the field component under consideration. For example, $J_m(\lambda'_{mi} r/a)$ was chosen for $B_z$ since $B_z \neq 0$ at r=a and $J_m(\lambda'_{mi}) \neq 0$. This tends to give a better representation of $B_z$ for a specific mode with a small number of terms than does an expansion in terms of $J_m(\lambda_{mi} r/a)$ which goes to zero at r=a. For $B_r$ and $E_\theta$ which do go to zero at r=a, we chose $J_1(\lambda_{1i} r/a)$ for the m=0 case and $J_0(\lambda_{0i} r/a)$ for the m=1 case. The field components $E_r$ and $B_\theta$ are nonzero at r=a and for those we used $J_1(\lambda'_{1i} r/a)$ for the m=0 case and $J_0(\lambda'_{0i} r/a)$ for m=1.

In practice, we typically used i=1,2,3,4 for each of the five field components $B_z$, $B_r$, $B_\theta$, $E_r$ and $E_\theta$ which produced a total of $4 \times 5 = 20$ equations for the unknown coefficients ($a_r$, $a_i$, $b_{pi}$, $b_{ti}$). Thus, in principle, the amplitudes of the 20 most significant modes could be determined by this approach, with all other modes assumed to make a negligible contribution.

When we tried to implement this in practice, we found that convergence of the Fourier Bessel series was not sufficiently rapid and truncation introduced large numerical errors. This could be seen by noting the effects of adding an additional mode and seeing the effect it has on the solution. It could also be seen by reconstructing the total fields from the solution and plotting the difference in the fields across the interface as a function of r.

In an attempt to reduce the effects of truncation, we next tried a minimization scheme. We constructed $$f = \sum_{i=1}^{N} |<[B_{zv} - B_{zp}]>_i|^2 + \sum_{i=1}^{N} |<B_{rv} - B_{rp}>_i|^2 + \ldots \qquad (29)$$

where $<>_i$ denotes the ith moment of the Bessel Function appropriate to the field component under consideration. The function f contains up to quadratic terms of each of the coefficients $a_r$, $a_i$, $b_{pi}$, $b_{ti}$. Actually, each of these coefficients is complex so 10 modes require 20 real coefficients. The function f may be minimized w.r.t. each of the real coefficients.

Here a fewer number of modes are considered so that f=0 is in general not attainable. For a minimum in f, we require $$\frac{\partial f}{\partial Re[a_i]} = 0 \qquad (30)$$

$$\frac{\partial f}{\partial Im[a_i]} = 0$$

$$\vdots$$

which produces a linear set of equations to solve for the coefficient. It was found that this procedure yielded far more consistent results as the number of coefficients was varied. However, one additional check on the solution revealed problems.

For the correct answer, the energy flux (Poynting flux) of the incident wave minus that of the reflected wave should equal the energy flux carried in the plasma. For some of the plasma parameters considered this conservation of energy flux was not well satisfied using the above minimization procedure. Therefore, for the final version of our solution procedure we added the energy and momentum constrains discussed in the next section.

5. Energy and Momentum Constraints

For the energy constraint, we require the time-averaged Poynting flux in the z direction $$S = \frac{1}{4} \left[ \frac{1}{\mu_0} (\vec{E} \times \vec{B}) \cdot \hat{z} + c.c. \right] \qquad (31)$$

to be equal on the vacuum and plasma sides of the interface. On the vacuum side, we have $$\vec{E} = \sum_{i=1}^{n} a_i \vec{E}_{vi} \text{ and } \vec{B} = \sum_{i=1}^{n} a_i \vec{B}_{vi}.$$

It can be shown for waveguides which have reflection symmetry and even transverse anisotropy that [2]

$$\int \hat{z} \cdot (\vec{E}_i \times \vec{B}_j) \, r dr d\theta = 0 \text{ if } i \neq j \qquad (32)$$

where i and j refer to waveguide modes. Therefore, we need consider only diagonal terms here. Furthermore, only propagating modes contribute to the energy flux so the condition we want to satisfy is $$S = \sum_{i=1}^{n_v} |a_i|^2 S_{vi} - \sum_{i=1}^{n_p} |b_i|^2 S_{pi} = 0 \qquad (33)$$

where the sums run over only the propagating modes, v refers to vacuum, p refers to plasma, and the S's are the Poynting fluxes for individual modes, e.g.

$$S_{vi} = \frac{1}{4} \frac{1}{\mu_0} \int (\vec{E}_{vi} \times \vec{B}_{vi}) \cdot \hat{z} + c.c. \qquad (34)$$

The other constraint we wish to impose on the interface matching conditions comes from momentum considerations. To derive it we begin with the force $$\vec{J} \times \vec{B} + \rho \vec{E} = \left( \frac{\nabla \times \vec{B}}{\mu_0} - \epsilon_0 \partial_t \vec{E} \right) \times \vec{B} + (\epsilon_0 \nabla \cdot \vec{E}) \vec{E}. \quad (35)$$

By using $\partial_t \vec{E} \times \vec{B} = \partial_t (\vec{E} \times \vec{B}) - \vec{E} \times \partial_t \vec{B}$, time averaging, and making use of some vector identities, the z component of Eq. (35) can be written $$(\vec{J} \times \vec{B} + \rho \vec{E}) \cdot \hat{z} = \quad (36)$$

$$-\partial_z \left( \frac{B^2}{2\mu_0} + \epsilon_0 \frac{E^2}{2} \right) + \mu_0^{-1} \nabla \cdot (\vec{B} B_z) + \epsilon_0 \nabla \cdot (\vec{E} E_z).$$

Integrating over a cylindrical volume from $z = z_1$ to $z = z_2$ we get $$\int_{z_1}^{z_2} (\vec{J} \times \vec{B} + \rho \vec{E}) \cdot \hat{z} \, d^3 x = \quad (37)$$

$$- \left\langle \left( \frac{B_\perp^2 - B_z^2}{2\mu_0} + \epsilon_0 \frac{E_\perp^2 - E_z^2}{2} \right) \right\rangle \bigg|_{z_1}^{z_2}$$

where $\langle \ \rangle$ denotes $\int r \, dr \, d\theta$. Some care must be taken in integrating across the plasma-vacuum interface at $z=0$, due to the possibility of a surface charge there. Suppose $z_1 \ll 0$ and $z_2 \gg 0$, we have $$- \left\langle \left( \frac{B_\perp^2 - B_z^2}{2\mu_0} + \epsilon_0 \frac{E_\perp^2 - E_z^2}{2} \right) \right\rangle \bigg|_{z_1}^{z_2} = \quad (38)$$

$$\int_{z_1}^{0^-} + \int_{0^-}^{0^+} + \int_{0^+}^{z_2} (\vec{J} \times \vec{B} + \rho \vec{E}) \cdot \hat{z} d^3 x.$$

Now the first integral is in the vacuum and since J and $\rho = 0$ there it must be zero, so $$\int_{z_1}^{0^-} (\vec{J} \times \vec{B} + \rho \vec{E}) \cdot \hat{z} d^3 x = 0 = \quad (39)$$

$$- \left\langle \left( \frac{B_\perp^2 - B_z^2}{2\mu_0} + \epsilon_0 \frac{E_\perp^2 - E_z^2}{2} \right) \right\rangle \bigg|_{z_1}^{0^-}$$

and the integral in the plasma may be written as $$\int_{0^+}^{z_2} (\vec{J} \times \vec{B} + \rho \vec{E}) \cdot \hat{z} d^3 x = \quad (40)$$

$$- \left\langle \left( \frac{B_\perp^2 - B_z^2}{2\mu_0} + \epsilon_0 \frac{E_\perp^2 - E_z^2}{2} \right) \right\rangle \bigg|_{0^+}^{z_2}$$

Finally, we want an expression for $$\int_{0^-}^{0^+} (\vec{J} \times \vec{B} + \rho \vec{E}) \cdot \hat{z} d^3 x \simeq \int_{0^-}^{0^+} \epsilon_0 \nabla \cdot \vec{E} E_z d^3 x \simeq \quad (41)$$

$$\int_{0^-}^{0^+} \epsilon_0 (\partial_z E_z) E_z d^3 x = \epsilon_0 \frac{E_z^2}{2} \bigg|_{0^-}^{0^+}.$$

Combining Eqs. (38-41), we obtain the desired result $$P = \left\langle \frac{B_\perp^2 - B_z^2}{2\mu_0} + \epsilon_0 \frac{E_\perp^2}{2} \right\rangle \bigg|_{0^-} - \quad (42)$$

$$\left\langle \frac{B_\perp^2 - B_z^2}{2\mu_0} + \epsilon_0 \frac{E_\perp^2}{2} \right\rangle \bigg|_{0^+} = 0.$$

Note that if the boundary conditions across the interface are satisfied, then this condition is trivially satisfied. However, when we use only a finite number of modes and truncate, then the above provides a useful constraint. As with the energy constraint, the above can be expressed as a sum over modes with the unknown coefficients $a_i$, $b_i$.

The minimization with constraints can now be performed using Lagrange multipliers. We form $$g = f + \lambda_s S + \lambda_p P \quad (43)$$

As before $$\frac{\partial g}{\partial Re[a_i]} = \frac{\partial g}{\partial Im[a_i]} = \frac{\partial g}{\partial Re[b_i]} = \frac{\partial g}{\partial Im[b_i]} = 0. \quad (44)$$

Here the values of $\lambda_s$ and $\lambda_p$ must be adjusted to yield $S = P = 0$. This is done numerically using a Newton-Raphson type root-finding algorithm.

Numerical results appear in the next section.

6. Results

In each of the cases presented in Table 1, $\omega = 2\pi \times 2.45$ GHz, $B = 0.5$ T, so that $\omega = 0.175 \omega_{ce}$. The radius of the cylinder was chosen as described in Section 2.

The number of modes used was determined by trial and error. In particular for the poorest fits we have verified that the addition of a few more modes does not help much. The Bessel function projections were described in Section 4. For example, four projections means that the four lowest Bessel function projections were performed upon each of the five field matching equations at the boundary. The $k_{zvac}$ values refer to the wave number of the incident wave, while $kz_{plas}$ refers to the wave number of the transmitted plasma wave with the smallest $k_\perp$.

The fit value was obtained from the fit function f of Section 4 via $$\bar{f} = \sqrt{f/(5 \times \# \text{ Bessel projections})} \ .$$

(The function g of Eq. (43) is equivalent to f after the Lagrange multipliers are properly chosen.) The resulting f is thus a rough measure of the average field error/incident field; $f = 0$ would be an exact solution. Note that the poorest fits were obtained for $TM_{01}$ and for $\omega_{pe} = \omega_{ce}$. The $TE_{01}$ solutions appeared to be the most accurate, while the $TM_{01}$ solutions for $\omega_{pe} = \omega_{ce}$ and $\omega_{pe} = 10 \omega_{ce}$ are quite inaccurate.

The reflected power indicates that a Q of 100 should be sufficient even at very high densities ($\omega_{pe}=10\omega_{ce}$ at B=0.5 T corresponds to $n_e=2.4\times 10^{20}/m^3$).

REFERENCES

1. D. G. Swanson, *Plasma Waves* (Academic Press, 1989).
2. R. E. Collin, *Field Theory of Guided Waves* (McGraw-Hill, 1960).

TABLE I

| Incident Mode | $\omega_{pe}/\omega_{ce}$ | Radius (cm) | Modes used plas/vac | # Bessel Projections | kz-vac (cm)-1 | kz-plas (cm)-1 | Fit normalized | Reflected (%) |
|---|---|---|---|---|---|---|---|---|
| TE11 | 0.1 | 4 | 6/6 | 4 | 0.226 | 0.258 | 2.04E-03 | 0.44 |
| TE11 | 1 | 4 | 10/6 | 6 | 0.226 | 1.42 | 2.96E-01 | 44 |
| TE11 | 10 | 4 | 10/6 | 4 | 0.226 | 13.48 | 6.40E-02 | 93.4 |
| TM01 | 0.1 | 6 | 10/9 | 6 | 0.32 | 0.157 | 4.08E-04 | 12 |
| TM01 | 1 | 6 | 17/13 | 8 | 0.32 | 1.41 | 4.24E-01 | 14.3 |
| TM01 | 10 | 6 | 11/5 | 4 | 0.32 | 13.48 | 2.32E-01 | 84 |
| TE01 | 0.1 | 10 | 5/4 | 4 | 0.34 0.45 | 0.43 | 1.14E-02 | TE: 0.0022 TM: 0.036 |
| TE01 | 1 | 10 | 10/9 | 6 | 0.34 0.45 | 1.45 | 1.43E-01 | TE: 60 TM: 11 |
| TE01 | 10 | 10 | 7/4 | 4 | 0.34 0.45 | 13.48 | 1.97E-02 | TE: 95 TM: 0.18 |

A.3 LASER APPLICATIONS

For laser applications, the axial excitation is inconvenient because it interferes with the optical system. Very high power lasers often use transverse pumping where the pumping power is brought in perpendicular to the optical axis. This can be done by placing many plasma sources in parallel, pointing perpendicular to the optical axis. At medium to low power, the cavity resonator is moved to the middle and is coupled to the plasma radially. The schematic of this approach is shown in FIG. 6 of the specification.

The radii of the cavity and the plasma chamber are chosen so $$J_1(lr_1)=J_1(lr_2)=0 \tag{50}$$

where $J_1$ is the first order Bessel function of the first kind, l is the radial wave number determined in part by Eq. (50), r is the radius of the cavity or plasma chamber, and the subscripts 1 and 2 denote the cavity and chamber, respectively.

The field pattern looks like that of the $TE_{02}$ mode. The slot couples the cavity and the plasma. For the $TE_0$ mode, the slot is used to let $B_z$ and $E_\theta$ through. Such slot may be a gap with several rods (spacers) across. The coupling strength and the k-spectrum in the plasma region depends on the slot design. The wave numbers in the cavity $k_v$ and in the plasma $k_s$ are given by $$k_v^2=\omega^2/c^2-l^2 \tag{51a}$$

and
In the regime $$k_s^2 = \omega^2/c^2 - (l^2/2) + [(l^2/2)^2 + \omega^2\Omega^2/c^4]^{\frac{1}{2}} \tag{51b}$$
$$l^2 >> \omega\Omega/c^2$$

it is seen that $$k_s^2 \approx \omega^2/c^2 + \chi^2\omega^2/(l^2c^4) \tag{52}$$

and $$k_s^2 \approx k_v^2 + l^2[1+\omega^2\Omega^2/(l^4c^4)] \gtrsim k_v^2 + l^2 \tag{53}$$

The length of the gap $\pi/k_s$ is given in terms of the length of the cavity $\pi/k_v$ $$\pi/k_s \approx (\pi/k_v)(1+l^2/k_v^2)^{-\frac{1}{2}} \tag{54}$$

At high plasma densities, i.e.

$$l^2 >> \omega\Omega/c^2,$$

it is seen that $$k_s^2 \sim k_v^2 + l^2/2 + \omega\Omega/c^2 \tag{55}$$

and $$k_s^2 \sim k_v^2 + l^2/2 + \omega\Omega/c^2 \tag{55}$$

and $$\pi/k_s \sim (\pi/k_v)[1+l^2/(2k_v^2)+\omega\Omega/(2k_v^2c^2)]^{-\frac{1}{2}} \tag{56}$$

The gap distance given by Eq. (56) is shorter than the value given by Eq. (54). To have good coupling during the start-up phase and at the final plasma density, multiple gaps may be used. The multiple gap arrangement produces the Fourier components covering the wave number given by Eq. (52) and Eq. (55).

What is claimed is:

1. Plasma production apparatus comprising:
   a substantially cylindrical plasma chamber having a longitudinal axis, said plasma chamber having a prescribed gas therein;
   magnetic field generating means for generating a magnetic field with an associated electron cyclotron frequency $\omega_{cc}$ and magnetic lines of force that axially traverse said plasma chamber; and
   resonant excitation means for exciting a whistler wave having a frequency $\omega$ in said plasma chamber using resonant electromagnetic energy, where $\omega_{cc} < \omega$, said whistler wave ionizing said prescribed gas, whereby ionized particles exist in said plasma chamber having a collisional frequency associated therewith, said ionized particles comprising a plasma;
   said resonant excitation means comprising a resonant cavity positioned adjacent a first end of said plasma chamber, said resonant cavity being substantially axially aligned with said longitudinal axis so that electromagnetic energy resonating in said resonant cavity axially couples into the plasma within said plasma chamber.

2. The plasma production apparatus as set forth in claim 1 further including plasma delivery means for controlling the delivery of plasma from said plasma chamber to a workpiece.

3. The plasma production apparatus as set forth in claim 2 wherein said workpiece is positioned adjacent a second end of said plasma chamber, said plasma delivery means directing plasma from said plasma chamber to said workpiece, whereby plasma processing may be carried out on said workpiece.

4. Plasma production apparatus comprising:
a substantially cylindrical plasma chamber having a longitudinal axis, said plasma chamber having a prescribed gas therein;
magnetic field generating means for generating a magnetic field with an associated electron cyclotron frequency $\omega_{cc}$ and magnetic lines of force that axially traverse said plasma chamber; and
resonant excitation means for exciting a whistler wave having a frequency $\omega$ in said plasma chamber using resonant electromagnetic energy, where $\omega_{cc} < \omega$, said whistler wave ionizing said prescribed gas, said resonant excitation means comprising:
a multiplicity of annular conductive rings within said plasma chamber, said rings being centered about and uniformly spaced along the longitudinal axis of the plasma chamber so as to form a slow wave structure inside of said plasma chamber, and
means for causing an electrical current to flow through said conductive rings so as to excite resonant electromagnetic energy that is radially coupled into said plasma, said radially coupled electromagnetic energy exciting said whistler wave within said plasma chamber;
whereby ionized particles exist in said plasma chamber having a collisional frequency associated therewith, said ionized particles comprising the plasma.

5. The plasma production apparatus as set forth in claim 4 wherein the electrical current flowing in said conductive rings excites said whistler wave using a $TE_{01}$ mode.

6. The plasma production apparatus as set forth in claim 4 wherein the electrical current flowing in said conductive rings excites said whistler wave using a $TE_{11}$ mode.

7. Apparatus for exciting a gas to produce a laser comprising:
a substantially cylindrical plasma chamber having a longitudinal axis, said plasma chamber having a prescribed gas therein;
magnetic field generating means for generating a mangetic field with an associated electron cyclotron frequency $\omega_{cc}$ and magnetic lines of force that axially traverse said plasma chamber; and
resonant excitation means for exciting a whistler wave having a frequency $\omega$ in said plasma chamber using resonant electromagnetic energy, where $\omega_{cc} < \omega$, said whistler wave ionizing said prescribed gas;
said plasma chamber being closed at both ends;
said closed plasma chamber and the plasma confined therein comprising part of an optical system that allows coherent light to reflect between two reflective surfaces, one placed at each end of said plasma chamber;
said resonant excitation means including a resonant cavity that surrounds at least a portion of said plasma chamber;
said resonant excitation means including means for exciting electromagnetic energy within said resonant cavity that is radially coupled into said plasma chamber so as to excite said whistler wave, said whistler wave, in turn, ionizing said prescribed gas and producing coherent light that reflects between said two reflective surfaces, thereby producing the laser.

8. The apparatus as set forth in claim 7 wherein said resonant cavity comprises a slotted resonant cavity surrounding said plasma chamber, said slotted resonant cavity having an inner wall at a first radius from said longitudinal axis, said slotted resonant cavity having periodically slotted gaps, the spacing of said gaps being determined by the wavelength of the excited whistler wave, and a solid outer wall spaced at a second radius from said longitudinal axis, said second radius being greater than said first radius.

9. Plasma production apparatus comprising:
a cylindrical cavity having a prescribed gas therein;
a magnetic field generator that generates a magnetic field having magnetic lines of force that axially traverse said cylindrical cavity; and
an electromagnetic launcher that generates and launches resonant electromagnetic energy into the gas held in said cylindrical cavity, said electromagnetic energy exciting a whistler wave that axially propagates through said cylindrical cavity following said magnetic lines of force and ionizes said prescribed gas, thereby producing a plasma;
said electromagnetic launcher comprising:
a resonant cavity positioned adjacent a first end of said cylindrical cavity, said resonant cavity being substantially axially aligned with a longitudinal axis of said cylindrical cavity, and
means for exciting the resonant electromagnetic energy in said resonant cavity, said resonant electromagnetic energy being coupled axially into said cylindrical cavity.

10. Plasma production apparatus comprising:
a cylindrical cavity having a prescribed gas therein;
a magnetic field generator that generates a magnetic field having magnetic lines of force that axially traverse said cylindrical cavity; and
an electromagnetic launcher that generates and launches electromagnetic energy into the gas held in said cylindrical cavity, said electromagnetic energy exciting a whistler wave that axially propagates through said cylindrical cavity following said magnetic lines of force and ionizing said prescribed gas, thereby producing a plasma;
said electromagnetic launcher comprising
a multiplicity of annular conductive rings within said cylindrical cavity, said rings being centered about and uniformly spaced along a longitudinal axis of the cylindrical cavity so as to form a slow wave structure inside of said cylindrical cavity, and
means for exciting an electrical current in said conductive rings so as to excite resonant electromagnetic energy within said cylindrical cavity, said resonant electromagnetic energy being coupled radially into the gas contained within said cylindrical cavity.

11. A method of producing plasma comprising:

(a) selectively injecting a specified gas into a cylindrical cavity, said cylindrical cavity having a longitudinal axis;

(b) generating a magnetic field having an associated electron cyclotron frequency $\omega_{cc}$ and magnetic lines of force that are substantially parallel to said longitudinal axis; and (c) generating resonant electromagnetic energy in a resonant cavity, said resonant cavity being positioned adjacent said cylindrical cavity; and (d) exciting a whistler wave in said cylindrical cavity by coupling the resonant electromagnetic energy from said resonant cavity into said cylindrical cavity, said whistler wave propagating through said cylindrical cavity following said magnetic lines of force and ionizing said prescribed gas, thereby producing a plasma, said whistler wave having a frequency $\omega$, where $\omega_{cc} > \omega$.

12. The method as set forth in claim 11 wherein step (c) further includes axially coupling the resonant electromagnetic energy into said cylindrical cavity.

13. The method as set forth in claim 11 wherein step (c) further includes radially coupling the resonant electromagnetic energy into said cylindrical cavity.

14. The method as set forth in claim 11 wherein said plasma is a high density plasma.

* * * * *

UNITED STATES PATENT AND TRADEMARK OFFICE
CERTIFICATE OF CORRECTION

PATENT NO. : 5,225,740
DATED : July 6, 1993
INVENTOR(S) : Tihiro Ohkawa

Page 1 of 2

It is certified that error appears in the above-indentified patent and that said Letters Patent is hereby corrected as shown below:

<u>ON THE TITLE PAGE</u>: After "(Washington D.C. 1991)" insert --(ISBN 0-309-04597-5)--  Column 1, line 39, after "plasma" insert a period. Column 1, line 41, after "become" insert a period. Column 6, line 16, after "damping" insert a period. Column 8, line 54, after "pressure" insert a period. Column 9, line 57, after "density, insert a period. Column 9, line 64, after "geometries" insert a comma. Column 10, line 15 and line 34, change "$B_2$" to --$B_z$--. Column 10, line 43, change "6" to --66--. Column 12, line 29, change "(2)" to --(a)--. Column 12, line 36, change "10·m-3" to --$10^{19}$ $m^{-3}$--. Column 15, line 4, after "case" insert --which--. Column 15, line 9, change Table 1 to --Table I--. Column 15, line 14, change "$\Delta$" to --$\nabla$--. Column 15, lines 21-22, change "$e^{ik_s z + im\theta - i\omega t}$" to --$e^{k_s z + im\theta - i\omega t}$--. Column 15, line 44, Equation (4), delete "'". Column 16, line 12, Equation (6), change "$kc_\perp$" to --$k_\perp c$--. Column 16, line 43, Equation (11), change "-" to --<--. Column 16, line 51, change "present" to --presence--. Column 16, line 51, change "equation" to --equations--. Column 16, line 52, change "$e^{-iwf}$" to --$e^{-i\omega t}$--. Column 17, line 40, change "$\kappa_i$" to --$\kappa_i$--. Column 17 line 41, change "$k_1^2$" to --$k_\perp^2$--.

UNITED STATES PATENT AND TRADEMARK OFFICE
CERTIFICATE OF CORRECTION

PATENT NO. : 5,225,740
DATED : July 6, 1993
INVENTOR(S) : Tihiro Ohkawa

It is certified that error appears in the above-indentified patent and that said Letters Patent is hereby corrected as shown below:

Column 18, line 9, Equation 23, change "$\delta$" to --$\delta_1$--, and change "$k^2_{\perp2}$" to --$k^2_{\perp2}$--. Column 18, line 27, Equation 24, insert a subscript --1-- after the first occurrence of "$\perp$". Column 18, line 39, change "ssen" to --seen--. Column 18, line 66, after "five" insert --field--. Column 19, line 20, change "same" to --same--. Column 19, lines 25, 30, 33, 35, 36, 38 change "$\tau/a$" to --$r/a$--. Column 20, line 43, change "$E_{vi}$" to --$\bar{E}_{vi}$--. Column 21, line 28, change "$\int$" to --$\int_0^\ell$--. Column 22, lines 63, 64, change "f" to --$\bar{f}$--. Column 23, line 43, change "1" to --$l$--. Column 23, line 66, Equation 52, change "$x^2\omega^2$" to --$\omega^2\Omega^2$--. Column 24, lines 33-35, delete the second occurrence of "$k^2_s - k^2_v + 1^2/2 + \omega\Omega/c^2$ - - (55)". Column 24, line 37, Equation 56, please place "(56)" at right margin. IN THE CLAIMS: Column 24, lines 52, 57 change "$\omega_{cc}$" to --$\omega_{ce}$--. Column 25, lines 17, 22, change "$\omega_{cc}$" to --$\omega_{ce}$--. Column 25, line 54, change "mangetic" to --magnetic--. Column 25, line 55, 61, change "$\omega_{cc}$" to --$\omega_{ce}$--. Column 27, line 5, change "$\omega_{cc}$" to --$\omega_{ce}$--. Column 28, line 2, change "prescribed" to --specified--. Column 28, line 4, change "$\omega_{cc}$" to --$\omega_{ce}$--.

Signed and Sealed this

Fourteenth Day of June, 1994

BRUCE LEHMAN

*Attest:*

*Attesting Officer*    Commissioner of Patents and Trademarks